(12) United States Patent
Becker et al.

(10) Patent No.: US 6,340,644 B1
(45) Date of Patent: Jan. 22, 2002

(54) METHOD FOR APPLYING A PROTECTING LACQUER ON A WAFER

(75) Inventors: Volker Becker, Marxzell; Franz Laermer, Stuttgart; Andrea Schilp, Schwaebisch Gmuend, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/355,299

(22) PCT Filed: Nov. 23, 1998

(86) PCT No.: PCT/DE98/03442

§ 371 Date: Sep. 20, 2000

§ 102(e) Date: Sep. 20, 2000

(87) PCT Pub. No.: WO99/28954

PCT Pub. Date: Jun. 10, 1999

(30) Foreign Application Priority Data

Nov. 28, 1997 (DE) .......................................... 197 52 926

(51) Int. Cl.⁷ ........................ H01L 21/31; H01L 21/469
(52) U.S. Cl. ........................ 438/782; 438/788; 118/410
(58) Field of Search ................................ 438/322, 404, 438/524, 527, 782, 973, 624, 788, 789, 902, 906; 118/410, 669, 680, 682, 708, 712

(56) References Cited

U.S. PATENT DOCUMENTS

| | | | | |
|---|---|---|---|---|
| 4,621,019 A | * | 11/1986 | Vikesland | .................... 428/347 |
| 5,820,677 A | * | 10/1998 | Yonaha | ....................... 118/680 |
| 5,851,733 A | * | 12/1998 | Sezi et al. | ................... 430/311 |
| 6,065,864 A | * | 5/2000 | Evans et al. | ............. 366/167.1 |
| 6,139,639 A | * | 10/2000 | Kitamura et al. | ........... 118/680 |
| 6,184,158 B1 | * | 2/2001 | Shufflebotham et al. | ..... 438/788 |

FOREIGN PATENT DOCUMENTS

| | | |
|---|---|---|
| JP | 56 110 232 | 9/1981 |
| JP | 01 147 307 | 6/1989 |
| JP | 03 046 353 | 2/1991 |
| JP | 09 260 276 | 10/1997 |

* cited by examiner

Primary Examiner—David Nelms
Assistant Examiner—Phuc T. Dang
(74) Attorney, Agent, or Firm—Kenyon & Kenyon

(57) ABSTRACT

A method for applying a protective resist, such as a negative resist, to a prepatterned wafer in which the resist is applied to the previously generated patterns by a distribution system which includes a holder for the wafer, an xy sliding unit with a programming device, and a dispensing device with a syringe.

15 Claims, 3 Drawing Sheets

METHOD FOR APPLYING A PROTECTING LACQUER ON A WAFER

FIELD OF THE INVENTION

The present invention relates to a method for applying a protective resist to a prepatterned wafer.

BACKGROUND OF THE INVENTION

Semiconductor wafers can be composed of a substrate and membranes produced by etching the substrate from the back. Silicon is preferably used as the substrate material and thus as the material for the membranes. In a number of sensor applications, patterns must be produced from the membranes by dry etching the front of the wafer, i.e., the side containing the membranes. In the case of dry etching, it is necessary to protect the membrane undersides, which were produced by cavern etching the substrate from the back, during the dry etching process.

This back protection performs the following important functions during dry etching, preferably using an anisotropic plasma etching process as the dry etching process.

The back protection prevents etching gases, such as fluorine, from attacking the membrane underside after etching through the front of the membrane, since the caverns are sealed by the protective layer and the membrane undersides are also covered, so that no free silicon that could be attacked by the etching gases, such as fluorine, is exposed on the back.

The back protection also makes it possible to overetch patterns in the plasma that are already etched through, i.e., the etchant attack on the silicon side walls of patterns already etched from the membrane is reduced because the undersides of the membrane are protected.

In addition, a seal is provided for the back of the wafer, to which helium must be applied toward the front as a convection medium during plasma etching to cool the substrate. This cooling thus continues even after the front membrane is partially etched through because the back protection prevents the helium from escaping into the chamber interior of the vacuum system.

Furthermore, the wafer is stabilized and the patterns, which are fragile after etching, are protected mechanically by the back resist. Even in the extreme case of wafer breakage, due to the fragile cavern regions, a fractured wafer can still be extracted from the plasma etching chamber as a single unit without leaving any fragments on the substrate electrode, which would require laborious cleaning of the plasma etching system.

Finally, the back protection can serve as a defined etching barrier. Because the silicon etching process stops when it reaches the resist layer, an end point detection system equipped with optical emission spectroscopy (OES) can be used to determine when the resist layer is reached. Without the resist, silicon etching would continue to the back of the wafer, i.e., there would be no detectable end point.

However, the back protection must also satisfy the following conditions:

The protective resist should always remain inside the caverns and not spread across the remaining back of the wafer so that the wafer does not stick to or contaminate the substrate electrode or components of the load-lock device.

In addition, the protective resist should not blister or flake during the plasma etching process, when it is subjected to thermal load, thus preventing contamination of the substrate electrode or the load-lock devices and ensuring that the back of the wafer, to which the helium is applied, remains sealed against the chamber interior.

There should also be adequate selectivity toward the positive resist, which, during plasma etching, is usually located on the front to define the pattern, so that the back resist in the caverns or used to protect local areas is not damaged when the positive resist on the front is developed by photolithography or removed during or at the end of the process.

SUMMARY OF THE INVENTION

Up to now attempts have been made to protect the back by applying a positive resist all over the back of the wafer and to pattern it through photolithography so that it remains only in the caverns and not on the remaining back of the wafer. However, using a positive resist at this point does not produce the desired result. It would not be possible to reliably apply negative resists or, in particular, non-photopatternable polymers in this manner, nor could they be restricted to the cavern interior. However, those resists that are the most resistant to hydrofluoric acid vapor, for example, cannot be photopatterned, since they lack functional groups, which are an important prerequisite for sealing against HF.

The use of a positive resist for filling the caverns is also associated with the following problems: it must be spun onto the wafer very thickly and subsequently photopatterned, i.e., exposed and developed. To do this, a sticky wafer, i.e., one which has not be completely baked or hardened, must be processed with appropriate lithographic equipment. Because they contain solvents and volatile non-crosslinked monomers, however, thick positive resists blister easily during drying and at high temperatures, and they tend to flake off the undersides of the caverns in large areas. In addition, the back of the wafer, which initially is sticky all over, makes it very difficult to process the wafer. This is due to the thick resist, which initially is located all over the wafer according to this method.

Because an identical resist type does not allow for adequate selectivity between the front resist and the back resist, difficulties arise when developing the front resist because, for example, the developer used to partially strip the front resist during developing also has a very corrosive effect on the back resist. The same is true when removing the front resist from the entire surface later on, if possible without damaging the back protection. Indeed, the back protection is also damaged to the extent that the wafer, for example, cannot be further processed if any additional steps are needed.

The positive resist also cannot provide a helium seal or adequate back protection after membrane etching because it blisters and becomes permeable in the plasma due to the thermal and chemical load imposed by the plasma etching process.

SUMMARY OF THE INVENTION

An object of the present invention is therefore to provide a method which overcomes the described disadvantages of the related art.

According to the present invention, a method is provided for applying a protective resist to a prepatterned wafer, characterized in that the resist is applied by a distribution system, which includes a holder for the wafer, an xy sliding unit with a programming device, and a dispensing device. The dispensing device dispenses the optimum protective resist and the optimum amount of protective resist selectively into the caverns.

In one example embodiment of the present invention, the protective resist is applied to the back of the wafer in micromechanically prepatterned caverns.

The use of a negative resist or a resist made of non-photopatternable polymers as the protective resist is also preferred. In this case, benzo cyclobutadiene, polymethyl methacrylate, polyimide, or epoxide can preferably be used. Due to their high chemical and thermal stability, negative resists are especially advantageous and yet they can be removed later on cleanly and without leaving a residue, for example in an oxygen plasma ambience.

The distribution system includes the following three components:

1. It has a holder for the wafer, allowing the latter to be positioned in the distribution system in a precisely defined, reproducible manner with respect to wafer orientation. This is achieved, for example, by a plate having a recess milled into the plate and corresponding to the wafer geometry, with this plate also encompassing the wafer flat. This clearly defines the position and alignment of the wafer.
2. The distribution system also includes an xy sliding unit with a programming device, which holds the actual sprayer and can selectively move to each individual cavern position, thus scanning the entire back of the wafer, controlled by a program. Each cavern in the wafer corresponds to one explicitly entered program position.
3. Finally, the distribution system also has a dispensing device, which is electrically connected to a programming device and is controlled by the latter, i.e., a device that can inject a precisely defined amount of resist from a syringe through a needle-shaped nozzle upon receiving a command from the program. The amount of resist injected can be predetermined by the applied injection pressure, the nozzle cross-section, and the preprogrammed injection time. The resist is preferably prevented from dripping at the end of injection by applying a vacuum which withdraws the resist from the nozzle immediately after injection. This reliably prevents resist droplets from falling onto the back of the wafer outside the caverns.

This distribution system, which was adapted specifically to the method according to the present invention, moves to a cavern position, injects a pre-selected amount of resist into the relevant cavern, and sends confirmation of the end of injection to the programming device, after which the distribution system moves on to the next cavern and repeats the process until all caverns in the wafer have been filled. At the beginning of the program, resist is first injected into a collecting vessel multiple times, such as five time, from an idle position in order to place the nozzle in a defined initial state and, in particular, to remove dried or thickened resist residue from the nozzle. The needle then passes by a resist wiper to wipe off any resist droplets still clinging to the needle before they reach the surface of the wafer and to also divert them to the collecting vessel. In its simplest form, this wiper can be the edge of the resist collecting vessel itself, which in this case must be high enough to allow the end of the needle to pass over it without contact, at the same time wiping off the resist droplets clinging to the needle as it passes by. At the end of the program, the distribution system returns to an end position, which can, but does not have to be, identical to the idle position to which the device moved in the beginning.

Using the distribution system, which moves to each cavern position on the back of a wafer, controlled by a program, using an xy sliding table, where an injector deposits a precisely defined amount of resist, all back caverns are uniformly filled with a freely selectable amount of protective resist without the resist contaminating any other point on the back of the wafer. It is also possible to provide each cavern with an individual amount of resist, especially if the caverns are of different sizes.

In a further preferred embodiment, the front of the wafer is coated with a positive resist.

In the method according to the present invention, the caverns in the back of the wafer can be selectively coated with a resist with the help of the distribution system, preferably using a negative resist or a resist which is resistant to the developers or solutions for partially or completely removing the positive resist on the front. This makes it possible to carry out front-side lithography and front-side aftertreatment or removal of the resist without impairing the protection on the back of the wafer, thus keeping it intact for subsequent processes.

The negative resist has an advantage over the positive resist in that it has a high chemical and thermal stability so that it does not blister or flake during baking or during subsequent plasma etching, fully maintaining its protective effect and, for example, avoiding the risk of contaminating the substrate electrode of the plasma etching device. In addition, the plasma etching process can be carried out reliably because wafer sealing and protection are guaranteed and an end point signal is defined by OES (optical emission spectroscopy).

In a further example embodiment, the protective resist is applied with the dispensing device with one or more injection operations per cavern. The injection operations can also take place from different positions above the caverns. The advantage of this is that the caverns can be filled very uniformly. For this purpose, resist can be injected multiple times into each cavern during the same pass, or multiple passes across the wafer can be performed.

It may also be necessary, especially in the case of complex cavern topographies, to provide different regions of the caverns with resist selectively. It is also possible to run the entire injection program multiple times across the same wafer, possibly with the use of offsets to reach different cavern positions. In addition, different resists can be used per program run or cycle. For example, it is possible to inject a thin resist, yet one which adheres firmly to the silicon, in a first program cycle and then, in a second program cycle, a thicker resist is used which by itself would not adhere well directly to the silicon, but which can nevertheless be applied in a thick layer. However, the first application of the thin resist allows the entire system of resist layers to adhere well to silicon because the second resist adheres well to the first, and the first adheres well to silicon.

The negative resists and positive resists according to the method are commercially available resists commonly used in semiconductor and micromechanical applications and sold by companies such as OCG, KTI Chemicals, and Hoechst.

The method according to the present invention now makes it possible in a highly advantageous manner to use a negative resist or other polymeric resists for coating the back of a wafer, with these resists being resistant or largely resistant to the developer or stripping solutions used for the positive resist on the front of the wafer. The positive resist can thus be photopatterned, developed or even completed removed at the end of the process without damaging the back protection. In particular, it is now also possible to use non-photopatternable protective resists which are especially resistant, for example, to hydrofluoric acid or other chemical reagents. The negative resists and the resists that are resistant to the developer or stripping solutions have the advantage that they do not blister during baking, adhere very well in the hard-baked state, are highly selective toward the positive resist, and do not foam during plasma etching or contaminate the substrate electrode of the plasma etching device. In addition, these resists have a high mechanical strength so that they can stabilize the wafer after etching and can also reliably withstand the helium pressure applied to the back and used to cool the wafer during plasma etching. One particular advantage is good stability in relation to the fluorine radicals in the plasma etching gas which occur during plasma etching.

In a further embodiment, the protective resist can also be applied to predetermined regions on specific, prepatterned fronts of the wafer to protect the latter, for example, against a corrosive medium. These regions can be, for example, regions of buried conductor paths and/or contact surfaces which need to be protected against a corrosive medium, e.g. hydrofluoric acid, in subsequent processes.

It is possible, for example, to selectively protect front regions with a negative resist or other, e.g. non-photopatternable, resists in this manner. This can be done, for example, prior to etching the sacrificial layer in hydrofluoric acid vapor if the reactive oxide is to remain in individual areas and therefore be protected. This may be necessary, for example, in the region of conductor paths that are buried by silicon dioxide or the region of contact surfaces for electrical insulation reasons, thus avoiding leakage currents. In the case of prepatterned wafer fronts, it is practically impossible to achieve selective coverage of the precise areas to be protected using methods such as spin-coating and photolithography.

The sliding unit preferably scans the front or back of the wafer, controlled by a program. However, electronic image processing can also be used to identify and move to the positions for applying the resist. This means that, instead of precisely positioning the wafer in a specific holder, it is also possible to simply place the wafer relatively imprecisely in the process station and identify and move to the cavern positions by electronic image processing. Image processing can also be used to simultaneously perform a quality check to determine the success of injection, i.e., a check is carried out to determine whether certain resist coating images were obtained.

Although image processing requires a highly complex electronic system, it renders superfluous the explicit programming of each individual cavern position in another advantageous embodiment of the present invention because the system simply injects resist into each cavern detected and "electronically" identified by the program. It is no longer necessary to individually adjust the program positions to the inserted wafer, but instead the program selects its own cavern positions via image processing, which greatly increases flexibility under manufacturing conditions and helps avoid errors. It is even possible for the program to detect the cavern size automatically and to dispense the optimum amount of resist specifically for each cavern, according to its size.

Instead of placing the wafer in the holder manually, it is also possible to combine this with an automatic loading system. This system can, for example, place one wafer after the other precisely into the process position from a cartridge station and then remove them again at the end of the process. It is also possible to use a less precise automatic handling system and equip it with an electronic image processing system for identifying and moving to the individual caverns, as described above.

BRIEF DESCRIPTION OF THE DRAWING

In FIG. 2, 13 designates a cavern wall of the wafer made of silicon. The cavern is filled with protective back resist 15. On the wafer is a membrane 14, which is also made of silicon. This membrane 14 can be produced directly from the wafer material or separated from the actual substrate wafer by an intermediate layer 16. Intermediate layer 16 is made primarily of $Sio_2$, which results in what is known as an SOI (silicon-on-insulator) wafer structure.

Figure 2:
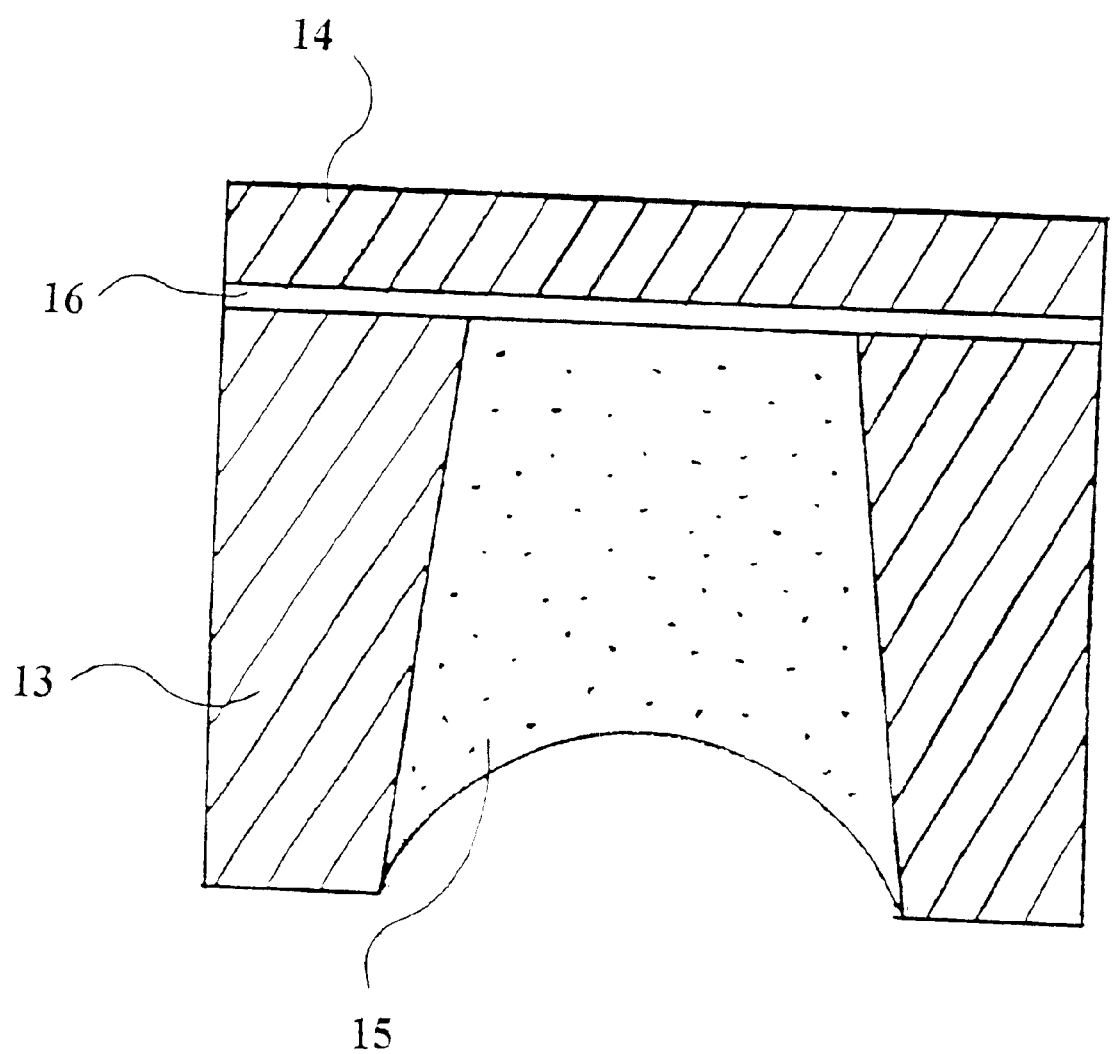
FIG. 2 shows a cross-sectional, partial view of the wafer processed by distribution system 1 illustrated in FIG. 1.
Figure 3:
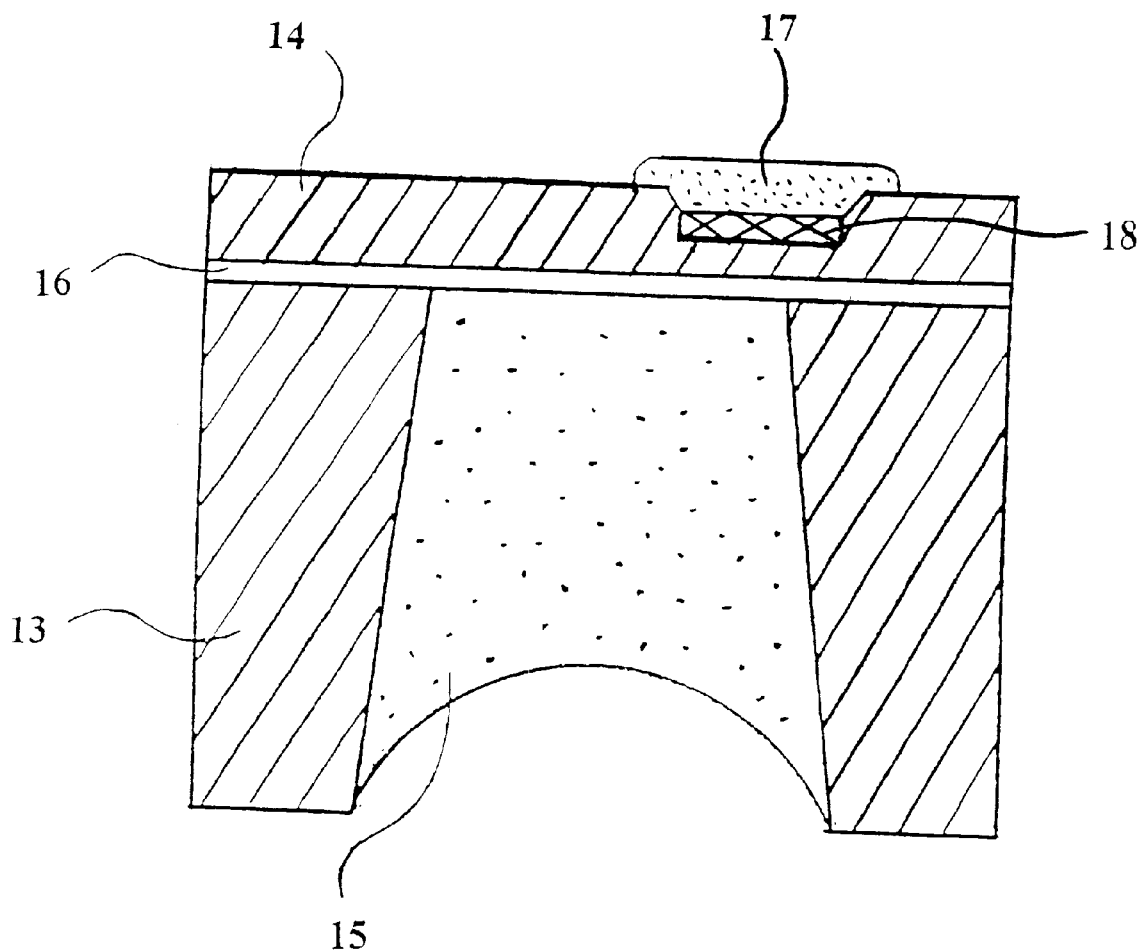
FIG. 3 also shows a cross-sectional, partial view of the wafer processed by distribution system 1 illustrated in FIG. 1.

This wafer cross-section corresponds to the one illustrated in FIG. 2, but an additional protective front resist 17, e.g. of the same type as the one on the back, is applied to a buried conductor path or contact surface 18.

LIST OF REFERENCE NUMBERS

1 Distribution system
2 Holder for the wafer
3 xy sliding unit
4 Syringe
5 Video camera
6 Programming device
7 Dispensing device
8 Monitor
9 Wafer
10 Wafer flat
11 Table
12 Hose
13 Cavern wall
14 Membrane
15 Protective back resist
16 Intermediate layer
17 Protective front resist
18 Buried conductor path or contact surface

What is claimed is:

1. A method for applying a protective resist to a prepatterned wafer, comprising the steps of:
   providing a distribution system which includes a holder for the prepatterned wafer, an xy sliding unit having a programming device and a dispensing device having a syringe; and applying the protective resist to the prepatterned wafer using the distribution system.

2. The method according to claim 1, wherein the applying step includes the step of applying the protective resist to a back side of the prepatterned wafer in micromechanically prepatterned caverns.

3. The method according to claim 1, wherein the protective resist includes one of a negative resist and a further resist, the further resist being composed of non-photopatternable polymers.

4. The method according to claim 3, wherein the protective resist is composed of one of benzo cyclobutadiene, polymethyl methacrylate, polyimide and epoxide.

5. The method according to claim 1, for the comprising the step of:

coating a front side of the patterned wafer with a positive resist.

6. The method according to claim 5, wherein the positive resist is photopatterned.

7. The method according to claim 1, wherein the applying step includes one of the following substeps:

(a) applying the protective resist in one of caverns using the syringe during at least one injection operation, and (b) applying a protective front resist in a depression of a front side of the prepatterned wafer using the syringe during the at least one injection operation.

8. The method according to claim 7, wherein the at least one injection operation is performed at least one time across the prepatterned wafer.

9. The method according to claim 7, wherein the at least one injection operation is performed from different positions above the caverns.

10. The method according to claim 1, wherein the applying step includes the step of applying the protective resist to predetermined regions on a prepatterned front side of the prepatterned wafer.

11. The method according to claim 10, wherein the predetermined regions include regions of buried conductor paths.

12. The method according to claim 10, wherein the predetermined regions include regions of contact surfaces.

13. The method according to claim 1, wherein the prepatterned wafer has a back side and a front side, and the method further comprising the step of:

scanning one of the front side and the back side using the xy sliding unit, the xy sliding unit being controlled by a program.

14. The method according to claim 1, further comprising the steps of:

identifying positions for applying the protective resist using an electronic image processing; and moving the xy sliding device to the identified positions.

15. The method according to claim 2, further comprising the steps of:

detecting a size of the caverns using an electronic image processing; and dispensing a predetermined amount of the protective resist individually for each of the caverns, the predetermined amount of the protective resist corresponding the size of the caverns.

* * * * *

UNITED STATES PATENT AND TRADEMARK OFFICE
CERTIFICATE OF CORRECTION

PATENT NO. : 6,340,644 B1
DATED : January 22, 2002
INVENTOR(S) : Becker et al.

It is certified that error appears in the above-identified patent and that said Letters Patent is hereby corrected as shown below:

Column 2,
Line 10, delete "SUMMARY OF THE INVENTION"
Line 54, change "DRAWING" to -- DRAWINGS --

Figure 1:
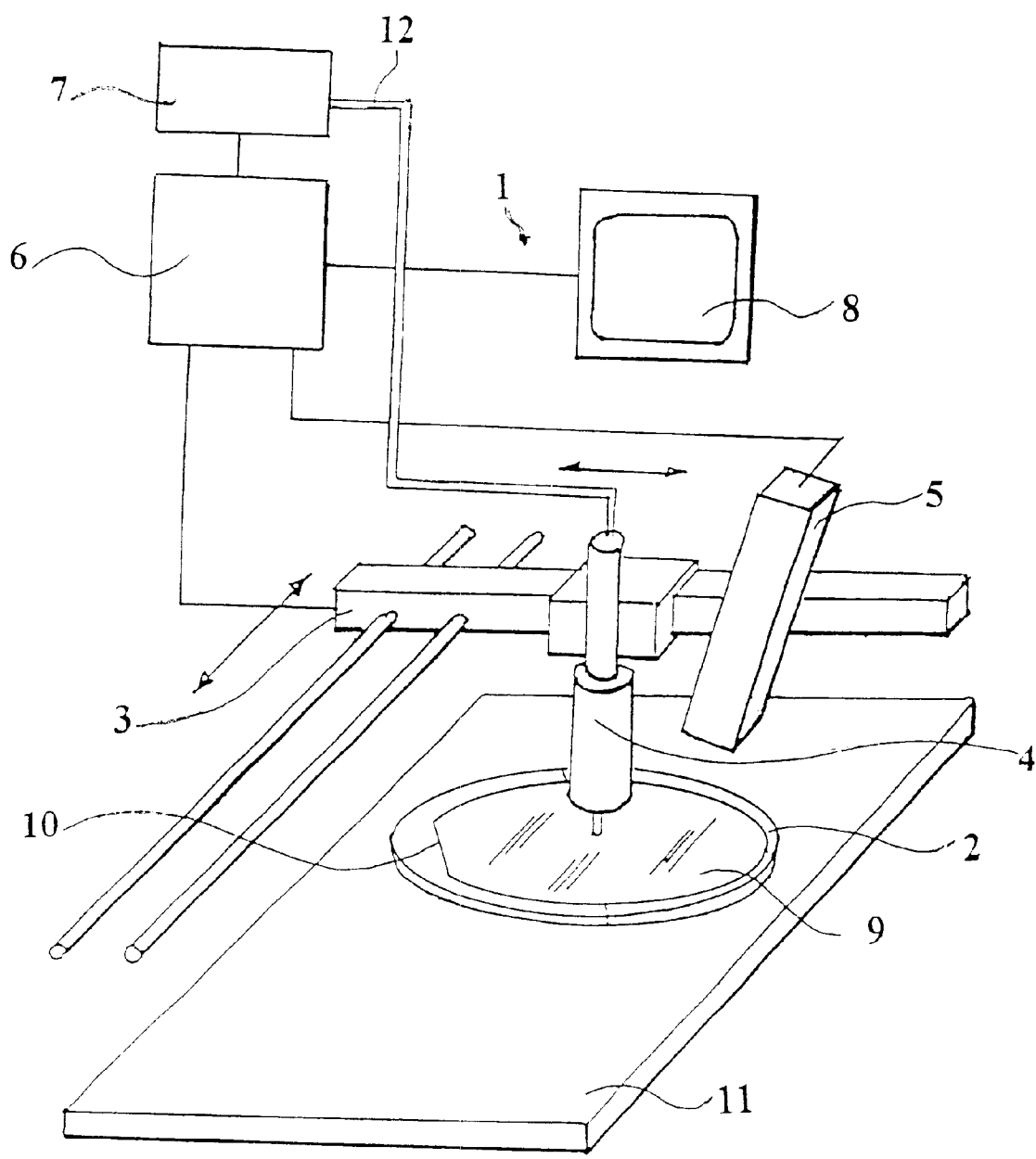
FIG. 1 shows distribution system 1, with which the method according to the present invention for applying protective resist 15, 17 to prepatterned wafer 9 is carried out. Distribution system 1 has a holder 2 for wafer 9 so that the latter is positioned in a precisely defined, reproducible manner with the wafer oriented in distribution system 1. Holder 2 can be in the shape of a plate into which is milled a recess which corresponds to the wafer geometry and also encompasses wafer flat 10, thus clearly defining the position and alignment of wafer 9. Holder 2 for wafer 9 is located on table 11. Distribution system 1 also includes an xy sliding unit 3 to which video camera 5 of the image processing system is attached, if necessary. Programming device 6 controls xy sliding unit 3, dispensing device 7 (injection commands and responses) as well as the image processing system and monitor 8, if provided. After receiving a program command from programming device 6, dispensing device 7 produces a brief overpressure, which results in injection, or a vacuum, which causes the resist to be withdrawn. The overpressure and vacuum pass through hose 12 to act upon syringe 4, which is filled with resist and injects the resist onto wafer 9 through a dispensing needle.

Column 6,
Line 1, change "BRIEF DESCRIPTION OF THE DRAWING" to -- BRIEF DESCRIPTION OF THE DRAWINGS --
Delete lines 2-23 and insert -- Figure 1 shows a distribution system 1, which performs the method according to the present invention, for applying a protective resist to a prepatterned wafer --

Signed and Sealed this

Eleventh Day of February, 2003

JAMES E. ROGAN
*Director of the United States Patent and Trademark Office*